(12) United States Patent
Samarao

(10) Patent No.: US 10,581,404 B2
(45) Date of Patent: Mar. 3, 2020

(54) TUNABLE LITHIUM NIOBATE RESONATORS AND FILTERS VIA LITHIATION AND DELITHIATION

(71) Applicant: Robert Bosch GmbH, Stuttgart (DE)

(72) Inventor: Ashwin Samarao, Sunnyvale, CA (US)

(73) Assignee: Robert Bosch GmbH, Stuttgart (DE)

( * ) Notice: Subject to any disclaimer, the term of this patent is extended or adjusted under 35 U.S.C. 154(b) by 689 days.

(21) Appl. No.: 15/258,712

(22) Filed: Sep. 7, 2016

(65) Prior Publication Data

US 2018/0069166 A1    Mar. 8, 2018

(51) Int. Cl.
*H03H 9/64* (2006.01)
*H03H 9/25* (2006.01)
*H03H 9/02* (2006.01)

(52) U.S. Cl.
CPC ............ *H03H 9/64* (2013.01); *H03H 9/0296* (2013.01); *H03H 9/02559* (2013.01); *H03H 9/02574* (2013.01); *H03H 9/25* (2013.01)

(58) Field of Classification Search
CPC .................................................. H03H 9/02559
See application file for complete search history.

(56) References Cited

U.S. PATENT DOCUMENTS

| 6,526,340 | B1 | 2/2003 | Reul et al. |
| 7,245,193 | B2* | 7/2007 | Funasaka ........... H03H 9/02574 333/193 |
| 8,575,819 | B1* | 11/2013 | Bhugra .................. H03H 9/173 310/317 |
| 2008/0042517 | A1 | 2/2008 | Stokes et al. |

FOREIGN PATENT DOCUMENTS

EP    1515436 A2    3/2005

* cited by examiner

*Primary Examiner* — Thomas M Dougherty
*Assistant Examiner* — Karen B Addison
(74) *Attorney, Agent, or Firm* — Maginot, Moore & Beck LLP

(57) ABSTRACT

A surface acoustic wave (SAW) device includes a silicon substrate, a piezoelectric substrate formed of lithium niobate, an alumina layer interposed between the silicon substrate and the piezoelectric substrate, and at least one electrode on the piezoelectric substrate.

6 Claims, 3 Drawing Sheets

TUNABLE LITHIUM NIOBATE RESONATORS AND FILTERS VIA LITHIATION AND DELITHIATION

TECHNICAL FIELD

The present application relates generally to surface acoustic wave devices, and, in particular, to systems and methods for tuning surface acoustic wave devices.

BACKGROUND

Surface acoustic wave (SAW) devices are a class of microelectromechanical systems (MEMS) which rely on the modulation of surface acoustic waves to sense a physical phenomenon. The sensor transduces an input electrical signal into a mechanical wave which, unlike an electrical signal, can be easily influenced by physical phenomena. The device then transduces this wave back into an electrical signal. Changes in amplitude, phase, frequency, or time-delay between the input and output electrical signals can be used to measure the presence of the desired phenomenon.

SAW technology takes advantage of the piezoelectric effect in its operation. A basic SAW device consists of a piezoelectric substrate and one or more interdigital transducers (IDTs). The piezoelectric substrate is formed of a piezoelectric material, such as quartz, lithium tantalite (LiTaO3) or lithium niobate (LiNbO3). An IDT is made of two metallic, comb-like structures arranged in an interdigital fashion on the surface of the piezoelectric substrate.

Saw devices typically have two IDTs, i.e., an input IDT and an output IDT. Surface acoustic waves are generated by applying an alternating voltage across the input IDT. The input IDT is fed a sinusoidal electrical input signal which creates alternating polarity between the fingers of the inter-digitated transducer. This creates alternating regions of tensile and compressive strain between fingers of the electrode by the piezoelectric effect, producing a mechanical wave at the surface known as a surface acoustic wave.

The wave is received by the output IDT which converts the mechanical energy from the wave back into an electric field using the piezoelectric effect. Any changes that were made to the mechanical wave will be reflected in the output electric signal because the characteristics of the surface acoustic wave will be modified by changes in the surface properties of the piezoelectric substrate.

SAW devices have a resonance frequency which is a function of the spacing between the input and output IDTs and the acoustic wave velocity of the material. When a surface acoustic wave is generated at or near the resonance frequency of the piezoelectric material, the insertion loss of the SAW device can be minimized. However, this also means that the frequency response of the device is established during manufacture. The ability to adjust, or "tune", the resonance frequency of SAW devices after manufacture is limited. As a consequence, the utilization of SAW devices is typically restricted to applications where the frequency response is fixed.

DETAILED DESCRIPTION

Figure 1:
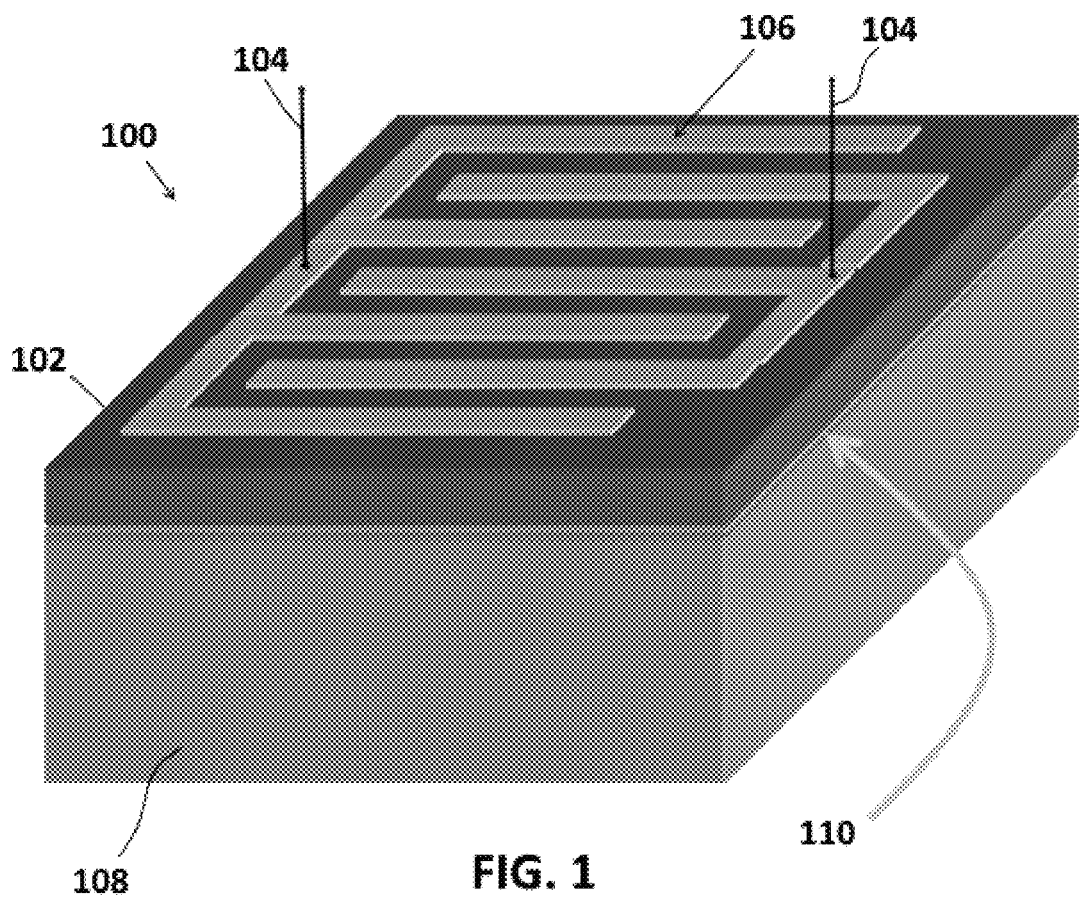
FIG. 1 is a schematic perspective view of an embodiment of a tunable SAW device in accordance with the present disclosure.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one of ordinary skill in the art to which this disclosure pertains.

FIG. 1 depicts a surface acoustic wave (SAW) device 100 in accordance with the present disclosure that is capable of being tuned in a simple and cost-effective manner. The tunable SAW device 100 includes a piezoelectric substrate 102, at least one interdigital electrode 106, a silicon substrate 108 and a metal oxide layer 110. The piezoelectric substrate is formed of lithium niobate. One or more interdigital electrodes are formed on the piezoelectric substrate for generating and/or receive surface acoustic waves in the piezoelectric substrate. The electrodes are formed of a conductive metal, such as aluminum, aluminum alloy, platinum, tantalum, or any other suitable conductive metal. In the embodiment of FIG. 1, a single interdigital electrode is shown. The interdigital electrodes include nodes 104 for connecting the electrodes 106 to other circuitry, such as signal generating and receiving circuits and signal evaluating circuits, not shown.

Figure 3:
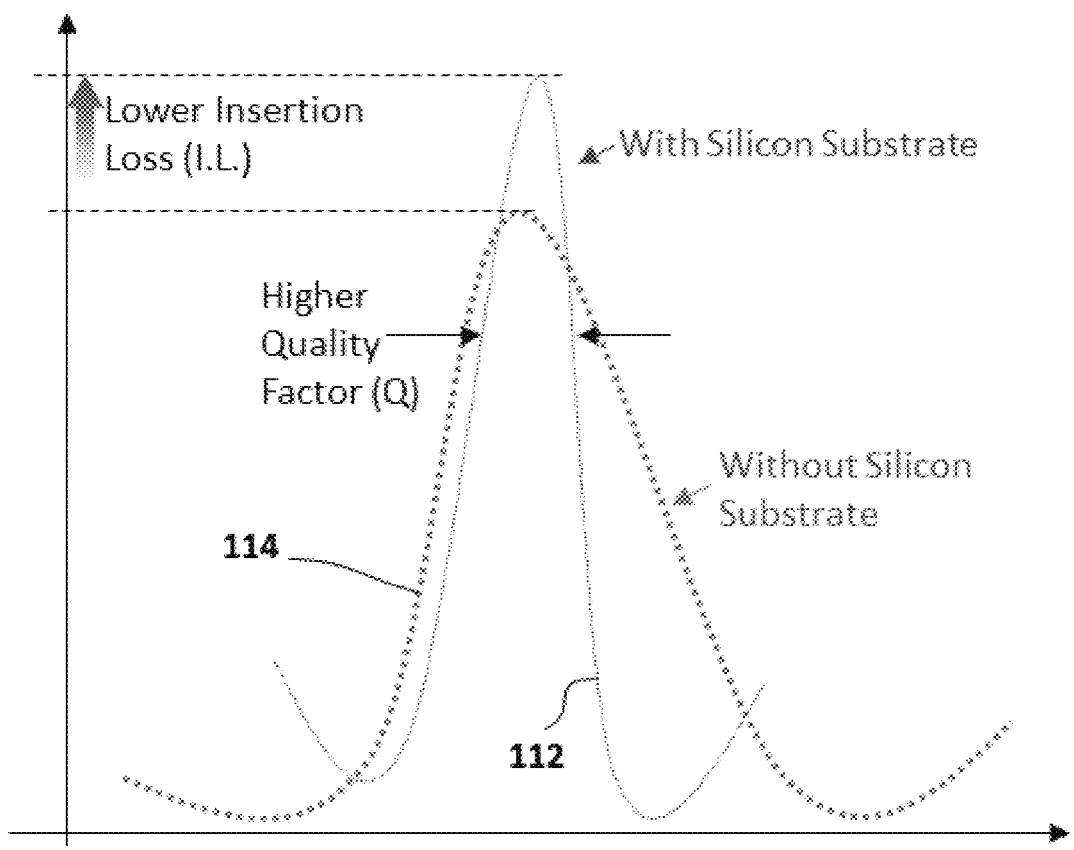
FIG. 3 is a graph showing a frequency response curve for a SAW device having a silicon substrate, such as depicted in FIG. 1, and a SAW device without a silicon substrate.

In one embodiment, the carrier substrate is formed of silicon. Silicon substrates have lower acoustic impedance and are known to conduct acoustic waves that result in higher quality factor and lower insertion loss. The silicon substrate also adds durability to the device construction and enables the integration of other circuit elements into the device for the SAW device, such as resonators and filters. FIG. 3 is a graph illustrating the change in the frequency response of a SAW device having a silicon substrate, such as depicted in FIG. 1, and a SAW device without a silicon substrate.

As can be seen in FIG. 3, the curve labeled 112 which represents the frequency response for a SAW device having a silicon substrate has narrower width than the curve labeled 114 which represents the frequency response of a SAW device without a silicon substrate which indicates that the SAW device with a silicon substrate has a higher quality factor (Q) than the device without a silicon substrate. The peaks of the curves are centered on the resonance frequency for the respective devices. The higher peak of the frequency response curve 112 for the SAW device with silicon substrate correlates to a lower insertion loss for the SAW device with silicon substrate than the SAW device without a silicon substrate.

Figure 2:
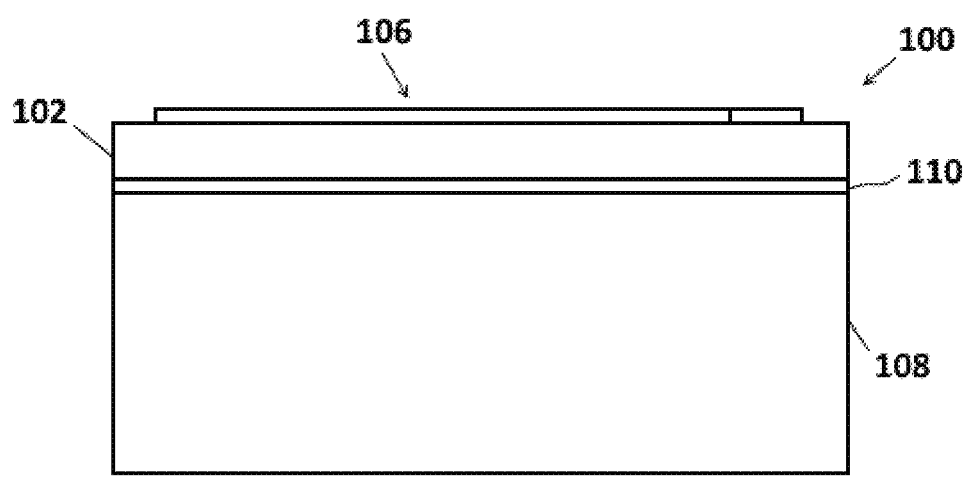
FIG. 2 is a schematic elevational view of the SAW device of FIG. 1.

Referring again to FIGS. 1 and 2, to enable tuning of the SAW device 100, a metal oxide layer 110 is inserted between the silicon carrier substrate 108 and the piezoelectric substrate 102. In one embodiment, the metal oxide layer 110 is formed of aluminum oxide, or alumina. The alumina layer 110 may be deposited in any suitable manner. In one embodiment, the alumina layer is deposited using an ALD process. The alumina layer may be deposited at a thickness in a range from approximately 10 nm to 1000 µm although any suitable thickness may be used including thicknesses which are outside of this range.

The alumina layer 110 between the lithium niobate substrate 102 and the silicon substrate 108 creates a structure similar to a Lithium-ion battery with the lithium niobate acting as the cathode, the silicon acting as the anode and the alumina acting as the electrolyte, more specifically, a solid electrolyte. When lithium-ion batteries are charged, a positive (+) voltage source applies a positive (+) voltage potential to the cathode. The positive (+) voltage potential forces the li-ions from the $LiCoO_2$ complex to migrate via the electrolyte and intercalate (to insert itself into interstitial or other vacancies) in the anode material. This ionic movement from cathode to anode via electrolyte is balanced by an electronic movement from the cathode to anode via an external circuit. This electrochemical process is referred to as de-lithiation. Similarly, when a lithium-ion battery is discharged, an electrical load is connected between the anode and cathode. Upon connection of an electrical load, the li ions diffuse back from the anode to the cathode via the electrolyte balanced by an electronic flow through the electrical load from anode to Cathode. This electrochemical process is referred to as lithiation.

Referring to FIG. 1, when a positive (+) DC bias is applied to the lithium niobate substrate 102, lithium ions from lithium niobate migrate from lithium niobate to the silicon of the silicon substrate 108 similar to the lithiation process for lithium-ion batteries. When an electrical load, e.g., a resistive load, is connected between the lithium niobate substrate 102 and the silicon substrate 108, lithium ions move back to the lithium niobate substrate 102 from the silicon substrate 108 similar to the de-lithiation process for lithium-ion batteries. By causing li-ions from the lithium niobate substrate to move into the silicon substrate (i.e., lithiation), the positive and negative charge centers become displaced in a piezoelectric material, such as lithium niobate. This displacement of the positive and negative charge centers changes the electromechanical coupling of the lithium niobate piezoelectric substrate. This in turn changes the acoustic resonance frequency of the lithium niobate substrate and, as a consequence, changes the resonance frequency of the SAW device 100. The lithium-ion battery-like configuration of the SAW device 100 thus enables the same electrochemical processes which are used to charge and discharge a lithium-ion battery, i.e., de-lithiation and lithiation, to be used to controllably and selectively adjust the resonance frequency of the SAW device.

Figure 4:
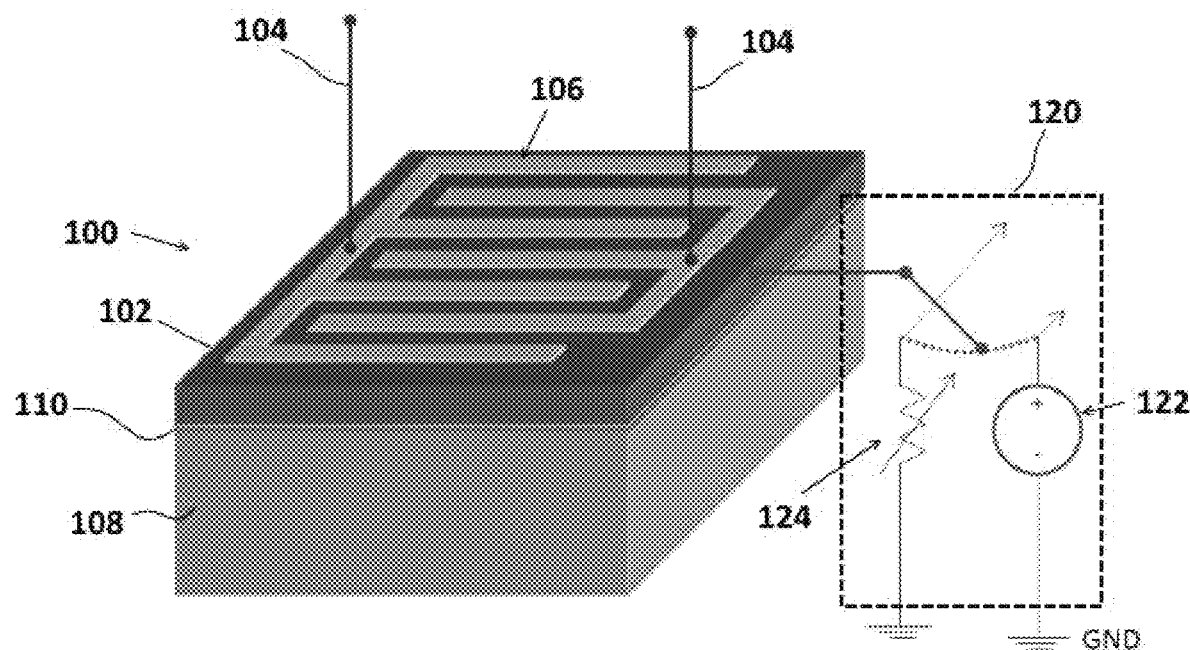
FIG. 4 is a schematic perspective view of a tunable SAW device, such as depicted in FIG. 1, with a tuning circuit.

Referring to FIG. 4, a schematic illustration of the SAW device 100 configured for tuning via de-lithiation and lithiation processes is depicted. For tuning the SAW device 100, the SAW device 100 is provided with a tuning circuit 120 that is connected between the lithium niobate substrate 102 and a reference potential, e.g., ground (GND). The tuning circuit 120 may be implemented in the silicon substrate or on a separate substrate and may be electrically connected to the SAW device 100 in any suitable manner.

Figure 5:
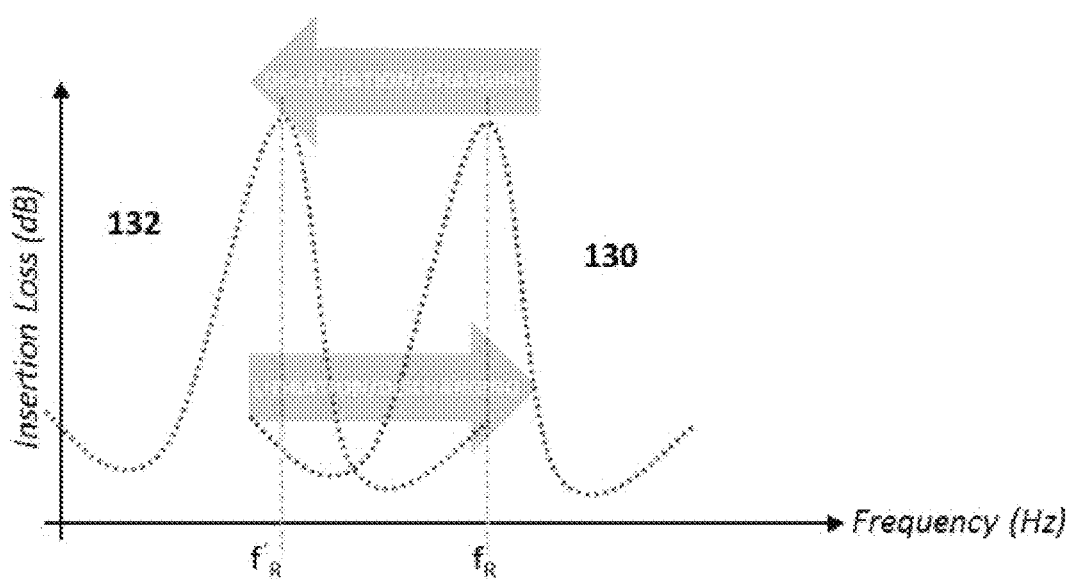
FIG. 5 is a graph indicating the direction of change of the resonance frequency for a tunable SAW device, such as depicted in FIG. 4, due to the tuning circuit for a de-lithiation and a lithiation process.

The tuning circuit 120 includes at least one of a voltage source 122 (for de-lithiation) and an electrical resistance element 124 (for lithiation). The voltage source 122 is electrically connected to lithium niobate substrate 102 and is configured to apply a positive (+) DC bias to the lithium niobate substrate 102. The voltage source 122 may be implemented in any suitable manner and may be configured to apply any suitable voltage level to the substrate for achieving a desired displacement of the charge centers of the lithium niobate substrate. The de-lithiation caused by the positive (+) DC bias results in an increase, e.g., "tuning up", of the resonance frequency $f_R$ of the SAW device as can be seen by referring to the curve labeled 130 in the graph depicted in FIG. 5.

The electrical resistance element comprises one or more resistive circuit elements which are configured to have a predetermined electrical resistance when connected to the lithium niobate substrate. In one embodiment, the electrical resistance element comprises a tunable resistor although any suitable type of resistive element or resistor may be used. The predetermined resistance of the electrical resistance element may be any suitable resistance for achieving a desired displacement of the charge centers of the lithium niobate substrate. The lithiation caused by the electrical resistance element results in a decrease, e.g., "tuning down", of the resonance frequency $f_R'$ of the SAW device as can be seen by referring to the curve labeled XXX in the graph depicted in FIG. 5.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A surface acoustic wave (SAW) device comprising:
   a silicon substrate having a main surface;
   a piezoelectric substrate formed of lithium niobate;
   a metal oxide layer interposed between the silicon substrate and the piezoelectric substrate; and
   at least one electrode on the piezoelectric substrate, and
   further comprising a tuning circuit electrically connected directly to the piezoelectric substrate and configured to alter a charge center of the piezoelectric substrate,
   wherein the tuning circuit includes a voltage source, the tuning circuit being configured to electrically connect the voltage source directly to the piezoelectric substrate, the voltage source being configured to apply a predetermined voltage to the piezoelectric substrate,
   wherein the predetermined voltage causes lithium ions from the lithium niobate of the piezoelectric substrate to migrate to the silicon substrate resulting in an increase in a resonant frequency of the SAW device.

2. The SAW device of claim 1, wherein the metal oxide layer is formed of alumina.

3. The SAW device of claim 2, wherein the at least one electrode comprises at least one pair of interdigital transducers.

4. The SAW device of claim 3, further comprising a pair of reflectors on the piezoelectric substrate positioned on opposing sides of the at least one pair of interdigital transducers.

5. The SAW device of claim 1, further comprising:
   at least one resistor, the tuning circuit being configured to electrically connect one of the resistor and the voltage source directly to the piezoelectric substrate at a time,
   wherein the at least one resistor is configured to cause the lithium ions to migrate from the silicon substrate to the piezoelectric substrate resulting in a decrease in the resonant frequency of the SAW device.

6. The SAW device of claim 5, wherein the resistor is a tunable resistor.

\* \* \* \* \*